United States Patent [19]

Blaker et al.

[11] Patent Number: 5,454,014
[45] Date of Patent: Sep. 26, 1995

[54] DIGITAL SIGNAL PROCESSOR

[75] Inventors: David M. Blaker, Emmaus; Gregory S. Ellard, Forest Park; Mohammad S. Mobin, Whitehall; Mark E. Thierbach, South Whitehall Township, Lehigh County, all of Pa.

[73] Assignee: AT&T Corp., Murray Hill, N.J.

[21] Appl. No.: 152,807

[22] Filed: Nov. 16, 1993

[51] Int. Cl.⁶ .............................. H03D 1/00; H04L 27/06
[52] U.S. Cl. ................................ 375/341; 371/43
[58] Field of Search ............................ 375/39, 94, 341, 375/262; 371/43, 44, 30; 341/94

[56] References Cited

U.S. PATENT DOCUMENTS

| | | | |
|---|---|---|---|
| 4,536,878 | 8/1985 | Rattlingourd et al. | 371/43 |
| 4,730,322 | 3/1988 | Pollara-Bozzola | 371/43 |
| 5,341,386 | 8/1994 | Shimoda et al. | 371/43 |
| 5,384,722 | 1/1995 | Dulang | 364/715.01 |

*Primary Examiner*—Stephen Chin
*Assistant Examiner*—Tesfaldet Bocure
*Attorney, Agent, or Firm*—John T. Rehberg

[57] ABSTRACT

A signal processor with an embedded Viterbi co-processor is disclosed. The Viterbi branch metric unit contains embedded metric units which calculate either Euclidean or Manhattan metrics for MLSE or deconvolution operations.

5 Claims, 1 Drawing Sheet

DIGITAL SIGNAL PROCESSOR

CROSS-REFERENCE TO RELATED APPLICATIONS

This application is related to the following concurrently filed, co-pending applications, each of which is incorporated herein by herein by reference:

application Ser. No. 08/153334, entitled "Efficient Utilization of Present State/Next State Registers", filed Nov. 16, 1993, by D. Blaker, M. Diamondstein, G. Ellard, M. Mobin, H. Sam and M. Thierbach, our docket number Blaker 3-2-3-3-4-10;

application Ser. No. 08/152531, entitled "Variable Length Tracebacks", filed Nov. 16, 1993, by D. Blaker, G. Ellard, and M. Mobin, our docket number Blaker 4-4-4;

application Ser. No. 08/153333, entitled "Power and Time Saving Initial Tracebacks", filed Nov. 16, 1993, by D. Blaker, G. Ellard, and M. Mobin, our docket number Blaker 6-6-6;

application Ser. No. 08/152805, entitled "Digital Receiver with Minimum Cost Index Register", filed Nov. 16, 1993, by D. Blaker, G. Ellard, M. Mobin and H. Sam, our docket number Blaker 2-2-2-3;

application Ser. No. 08/153405, entitled "Digital Processor and Viterbi Decoder Having Shared Memory", filed Nov. 16, 1993, by M. Diamondstein, H. Sam and M. Thierbach, our docket number Diamondstein 1-2-8;

application Ser. No. 08153391, entitled "Digital Signal Processor", filed Nov. 16, 1993, by D. Blaker, G. Ellard and M. Mobin, our docket number Blaker 1-1-1.

TECHNICAL FIELD

This invention relates generally to digital signal processors.

BACKGROUND OF THE INVENTION

Mobile communication devices, such as mobile digital cellular telephones, often employ digital signal processors for processing and filtering received and transmitted digital signals. Often, a separate chip is provided to implement a Viterbi process for correcting errors or decoding incoming signals.

The Viterbi process is a maximum likelihood decoding process that provides forward error correction. The Viterbi process is used in decoding a bit stream sequence of encoded signals or signals which have been corrupted by intersymbol interference or noise. The bit stream may represent encoded information in a telecommunication system transmission through various media with each set of bits representing a symbol instance. In the decoding process, the Viterbi algorithm works back to a sequence of possible bit sequences at each symbol instant to determine which one bit sequence is most likely to have been transmitted. The possible transitions from a bit state at one symbol instant to a bit at a next, subsequent symbol instant is limited. Each possible transition from one state to a next state may be shown graphically as a trellis and is defined as a branch. A sequence of interconnected branches is defined as a path. Each state can only transition to a limited number of the next states upon receipt of the next bit in the bit stream. Thus, some paths survive and others do not survive during the decoding process. By eliminating those transitions that are not permissible, computational efficiency can be achieved in determining the most likely paths to survive. The Viterbi process typically defines and calculates a branch metric associated with each branch and employs this branch metric to determine which paths survive and which paths do not survive.

Typically, the Viterbi process is implemented on a chip which is separate from the digital processing chip. The Viterbi process is usually implemented in software which is executed by this separate chip. Incoming signals are first routed to the Viterbi processor for decoding. The decoded signals are then routed to the digital signal processor for further processing.

As mobile communication devices proliferate, there remains a need for a faster, more efficient processing of incoming signals.

SUMMARY OF THE INVENTION

The present invention provides fast, efficient processing of signals by including in an illustrative embodiment, a digital processor having a core processor unit and an embedded co-processor which implements a Viterbi decoding function. The co-processor has a branch metric unit for determining metrics for branches of a Viterbi trellis and operates under the control of the core processor unit, and is adapted to determine branch metrics according to directive provided by the core unit.

DETAILED DESCRIPTION

Figure 1:
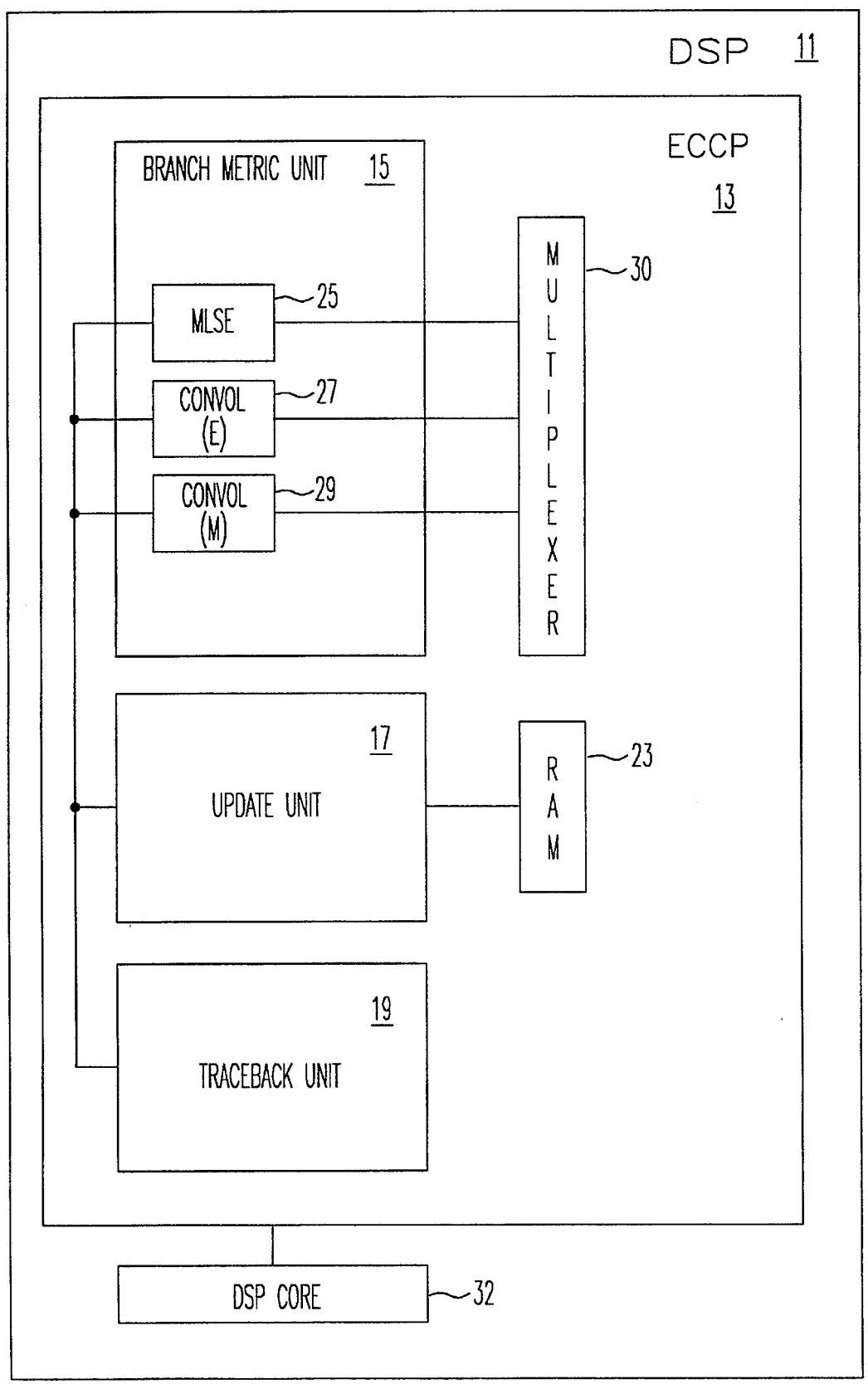
FIG. 1 is a diagram showing an illustrative embodiment of the present invention.

In decoding data using the Viterbi process from a series of real or complex binary data received at a decoder, the decoder reconstructs the sequence of data most likely transmitted. The decoder considers all possible state combinations and produces estimates of signals for all possible state transitions and compares them with received data to determine what was the most likely transmitted bit sequence. The initial state of the encoder is known so, therefore, the decoder has a starting point. The end state of the encoder is also known, so the decoder also has a predetermined ending point. The decoder determines the most likely sequence of state transitions for the received series of binary data. Each such state represents a symbol instant. At each symbol instant, there are a number of states that range from 0 up to $2^{C-1}-1$ where C is the constraint length. A typical range for C would be from 2 to 7. These $2^{C-1}$ states will be referred to as individual states. A limited number of transitions are possible. At each symbol instant, the accumulated cost is calculated for each of the possible transitions. The trellis path having the extremum (i.e., minimum or maximum) cost may thereby be determined.

At each symbol instant, each individual state can only progress to a limited number of possible next individual states. In addition, each next individual state has only a limited number of possible previous individual states from which a transition to it can originate.

A branch metric is calculated at each symbol instant for each possible transition from all possible states to the next individual state. Various methods for calculating branch metrics are known in the an and will be detailed below. The branch metric for all branches transitioning to a given next individual state are calculated, then added to the accumulated cost of the respective originating individual state, resulting in two or more potential accumulated cost sums. A comparison is made of the various potential accumulated cost sums. In one embodiment of the invention the lesser of the cost sums is selected as the next state accumulated cost. The transition corresponding to the lesser sum is the more likely transition from the two possible originating individual states to the given next individual state. The originating individual state of the more likely transition is stored as the surviving origin of a branch to the given next individual state. The lesser sum is the accumulated cost of the next individual state and replaces the accumulated cost for that individual state. This process is repeated for each of the next individual states and repeated also for each symbol instant until all symbols in the bit stream are decoded.

FIG. 1 is a schematic diagram of digital signal processor 11 having embedded error-correcting co-processor (ECCP) 13 and a DSP core 32. DSP core 32 sets the operational parameters of the ECCP 13, such as moderate constraint length, and branch metric type, (Euclidean or Manhattan). Core 32 also initiates the Viterbi decoding function of ECCP 13.

Within ECCP 13 is update unit 17, traceback unit 19, and branch metric unit 15. Update unit 17 performs the add compare select operations of the Viterbi process. At every symbol instant there are $2^C$ state transitions of which $2^{C-1}$ state transitions survive. The update unit performs the add-compare-select operation and updates $2^{C-1}$ accumulated cost states in RAM 23. The update unit stores the accumulated cost of each path at whatever symbol instant is under analysis.

Traceback unit 19 selects a path within the disclosed embodiment, the smallest path metric among $2^{C-1}$ survivor paths at every symbol instant. The last bit of the path corresponding to the maximum likelihood sequence is delivered to the decoder output. The depth of this last bit is programmable at the symbol rate. If the end state is known, the traceback decoding may be forced in the direction of the correct path by writing the desired end state into a minimum cost index register.

Branch metric unit 15 calculates for each symbol instant, the branch metric for each possible transition.

A variety of metrics have been proposed by those skilled in the art for comparatively evaluating individual branches on the trellis. In the past, Viterbi decoders which utilize branch metric units perform the Viterbi process using a single predetermined preprogrammed metric. By contrast, the present invention provides a branch metric unit capable of utilizing a variety of metrics.

ECCP 13 may be employed to deconvolve signals which have been encoded by a convolutional encoder. In addition, ECCP 13 may be employed to provide maximum likelihood sequence estimation (MLSE) equalization.

In certain applications, ECCP 13 may be required to perform an MLSE process. (In other applications, the ECCP 13 may be required to perform a convolutional decoding as discussed below.) In wide-band, low data rate applications, additive white gaussian noise (AWGN) is the principal channel impairment and a Euclidean branch metric provided by equation (1) is appropriate for MLSE operation. An Euclidean metric appropriate for MLSE processes is given by $$BM=(Z_I-E_I)^2+(Z_Q-E_Q)^2 \qquad (1)$$

where

BM=branch metric $Z_I$=received in-phase signal component $Z_Q$=received quadrature signal component $E_I$=estimated received in-phase component for each state transition $E_Q$=estimated received quadrature component for each state transition Consequently, DSP core 32 selects MLSE operation metric unit 25 with an embedded Euclidean branch metric unit. Metric unit 25 performs Euclidean metric calculations on incoming signals as part of an MLSE process.

By contrast, When convolutional decoding is to be performed, either an Euclidean or a Manhattan metric may be appropriate. For example, convolutional decoding over a gaussian channel may require a Euclidean distance measure for rate 1/1 or 1/2 encoding. By contrast, convolutional decoding preceded by MLSE or other linear/non-linear equalization may require a Manhattan distance measure for code rates 1/1 to 1/6. For convolutional decoding with a 1/1 code rate, an Euclidean metric given by equation 2 may be appropriate:

$$BM=(S_O-E_O)^2 \qquad (2)$$

where

BM=branch metric $S_O$=received signal component $E_O$=estimated signal component For convolutional decoding with a 1/2 code rate, an Euclidean metric given by equation 3 may be appropriate:

$$BM=(S_O-E_O)^2+(S_I-E_I)^2 \qquad (3)$$

where

BM=branch metric $S_O$=received first signal component $S_I$=received second signal component $E_O$, $E_I$=corresponding estimated signal component associated with each state transition By contrast, a Manhattan branch metric is provided by equation 4:

$$BM = \sum_{i=1}^{m} |S_i - E_i| \qquad (4)$$

for m=1, 2, 3, 4, 5, 6 depending upon code rate which is 1/m where

BM=branch metric $S_i$=received $i^{th}$ signal $E_i$=estimated $i^{th}$ signal (Note: higher values of m are also permissible). Consequently, when convolutional decoding requiring an Euclidean distance measure is required, metric unit 27 calculates Euclidean metrics. However, should convolutional decoding utilizing a Manhattan metric be required, operation of metric unit 29 is invoked by control unit to perform the required metric operation. Whichever metric units 25, 27 and 29 is selected, it calculates the appropriate metric for each incoming signal. Whichever of the three units, 25, 27 or 29, is utilized, the output is provided to multiplexer 30 and then used in the add-compare-select operation performed by update unit 17.

Of course, additional metric units may be employed and other metrics such as Hamming may be performed by any of the metric units.

We claim:

1. An integrated circuit comprising:

a digital processor for performing a signal processing function, said digital processor having a core processor unit;

an embedded co-processor which implements a Viterbi decoding function, said co-processor having a branch metric unit for determining metrics for branches of a Viterbi trellis, said branch metric unit being capable of determining a plurality different types of branch metrics, and operating under the control of said core processor, and being adapted to determine any one of said plurality of different types of branch metrics.

2. The device of claim 1 in which said branch metric unit is adapted to determine branch metrics according to either Euclidean metrics or Manhattan metrics.

3. The device of claim 1 in which said branch metric unit has a plurality of embedded metric units, each unit being capable of performing a different type of metric determination.

4. The device of claim 1 in which said branch metric unit has three embedded metric units, the first of said metric units being capable of determining Euclidean metrics for an MLSE process; the second of said metric units being capable of determining Euclidean metrics for a deconvolution process; the third of said metric units being capable of determining Manhattan metrics for a deconvolution process.

5. The device of claim 3 in which there are at least two embedded metric units, each being capable of performing a metric calculation chosen from the group consisting of Euclidean, Manhattan and Hamming.

* * * * *